(12) United States Patent
Minami et al.

(10) Patent No.: US 8,435,651 B2
(45) Date of Patent: May 7, 2013

(54) WOOD CUTTING TOOL

(75) Inventors: Toru Minami, Niwa-gun (JP); Satoru Nishio, Niwa-gun (JP)

(73) Assignee: Kanefusa Kabushiki Kaisha, Aichi (JP)

( * ) Notice: Subject to any disclaimer, the term of this patent is extended or adjusted under 35 U.S.C. 154(b) by 175 days.

(21) Appl. No.: 12/736,517

(22) PCT Filed: Apr. 22, 2009

(86) PCT No.: PCT/JP2009/058021
§ 371 (c)(1),
(2), (4) Date: Oct. 14, 2010

(87) PCT Pub. No.: WO2009/131159
PCT Pub. Date: Oct. 29, 2009

(65) Prior Publication Data
US 2011/0033722 A1    Feb. 10, 2011

(30) Foreign Application Priority Data

Apr. 25, 2008   (JP) ................................. 2008-116223

(51) Int. Cl.
*B32B 9/00*     (2006.01)
(52) U.S. Cl.
USPC ............... 428/698; 51/307; 51/309; 428/216; 428/336; 428/469; 428/472
(58) Field of Classification Search ............. 51/307, 51/309; 428/216, 336, 469, 472, 698
See application file for complete search history.

(56) References Cited

U.S. PATENT DOCUMENTS

| 8,025,991 B2 * | 9/2011 | Schier | 428/698 |
| 2005/0241447 A1 * | 11/2005 | Marcuzzi | 83/13 |

FOREIGN PATENT DOCUMENTS

| CA | 2172366 | * | 3/1995 |
| EP | 739697 | * | 9/2004 |
| JP | H02-252501 | | 10/1990 |
| JP | 04-135107 | * | 5/1992 |
| JP | H08-132310 | | 5/1996 |
| JP | 2816511 | | 10/1998 |
| JP | H11-236670 | | 8/1999 |
| JP | 2002-103304 | | 4/2002 |
| JP | 2007-276271 | | 10/2007 |
| JP | 2007-290180 | | 11/2007 |
| JP | 2009-067043 | | 4/2009 |

\* cited by examiner

*Primary Examiner* — Archene Turner
(74) *Attorney, Agent, or Firm* — DLA Piper LLP (US)

(57) ABSTRACT

Provided is a wood cutting tool with improved wear resistance and corrosion resistance. A hard fundamental layer (18) of chromium nitride (CrN) is subjected to PVD to be coated on a rake face (16) of a substrate (12) formed of a cemented carbide alloy or a tool steel. The hard fundamental layer (18) has a five-layer structure having a first layer (18a) to a fifth layer (18e) disposed in order from the substrate (12) side. A hard main layer (20) of chromium oxide ($Cr_2O_3$) is coated on the outer surface of the fifth layer (18e) of the hard fundamental layer (18). The hard main layer (20), like the hard fundamental layer (18), is formed by PVD. The hard fundamental layer (18) is coated with the hard main layer (20) to suppress corrosion, thereby improving the wear resistance and corrosion resistance of a cemented carbide replaceable knife (10).

1 Claim, 14 Drawing Sheets

Fig. 1
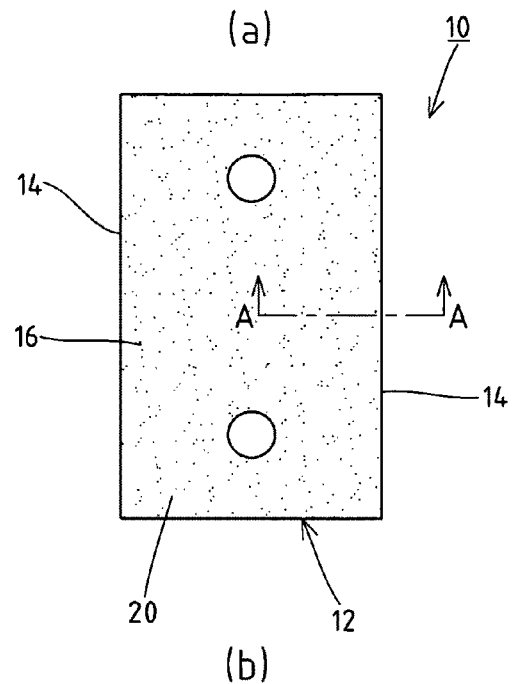
(a)
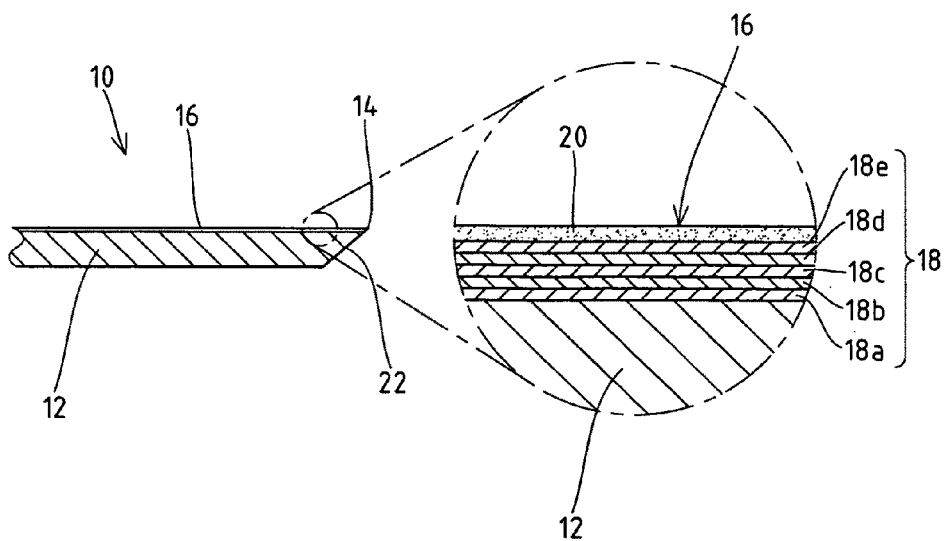
(b)

Fig.2
(a)
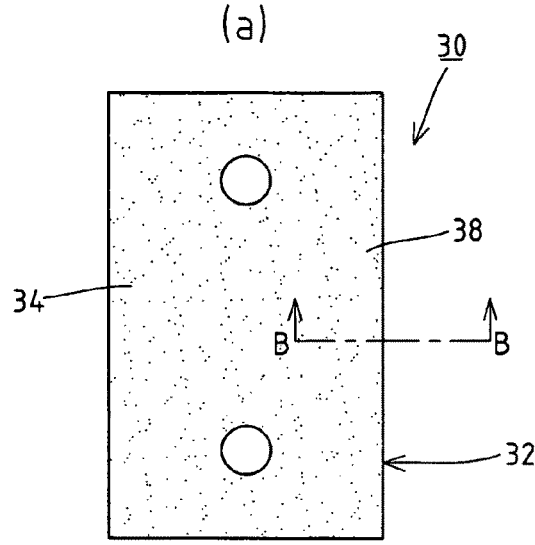
(b)
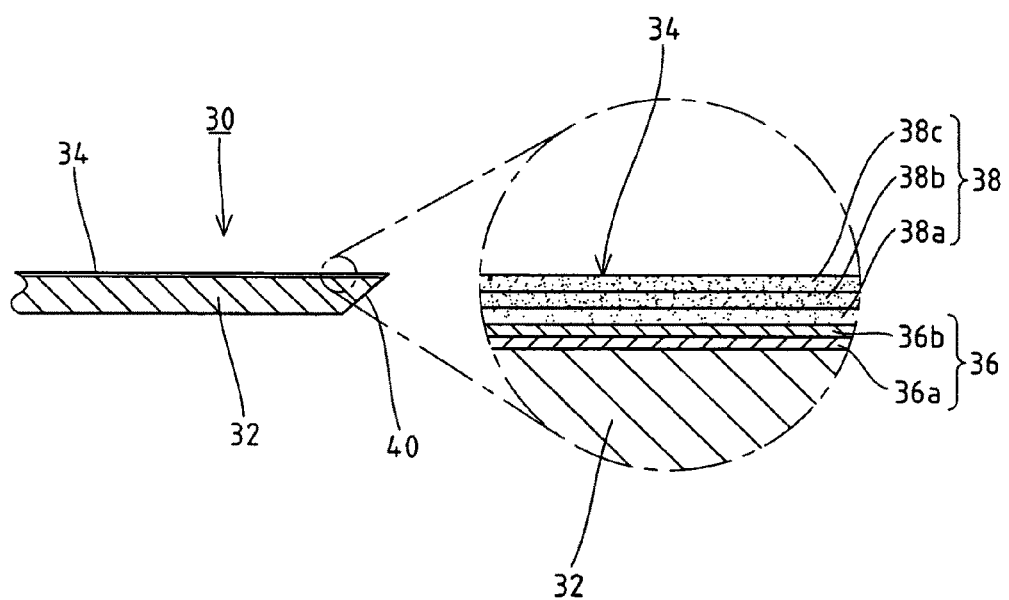

Fig.3
(a)
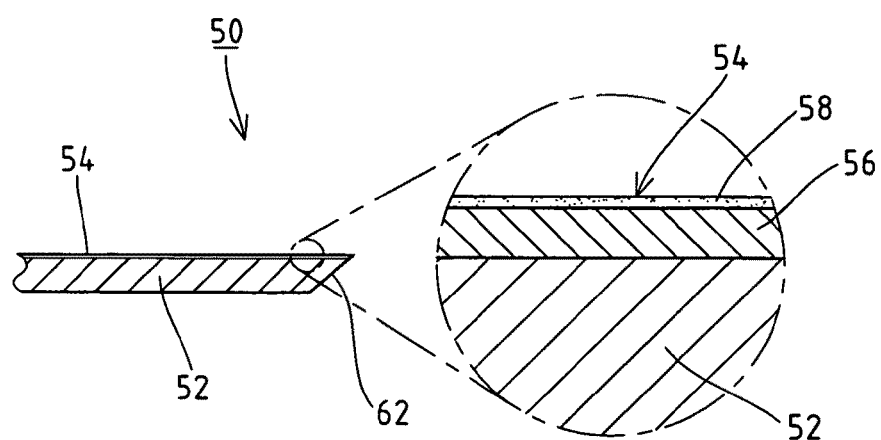
(b)
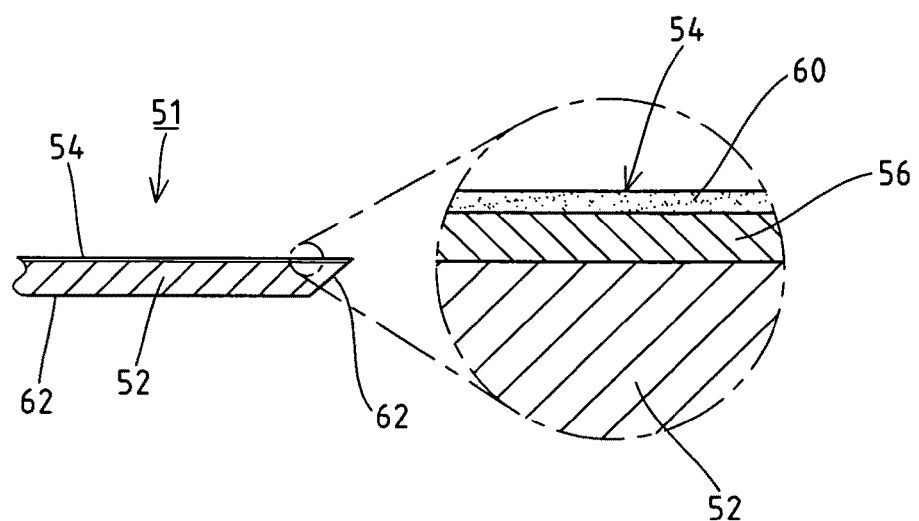

Fig. 12
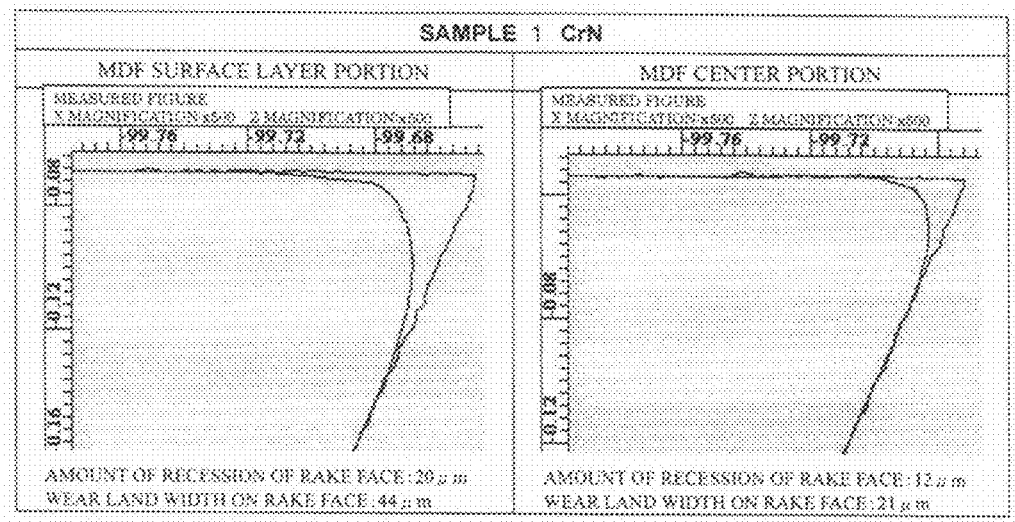
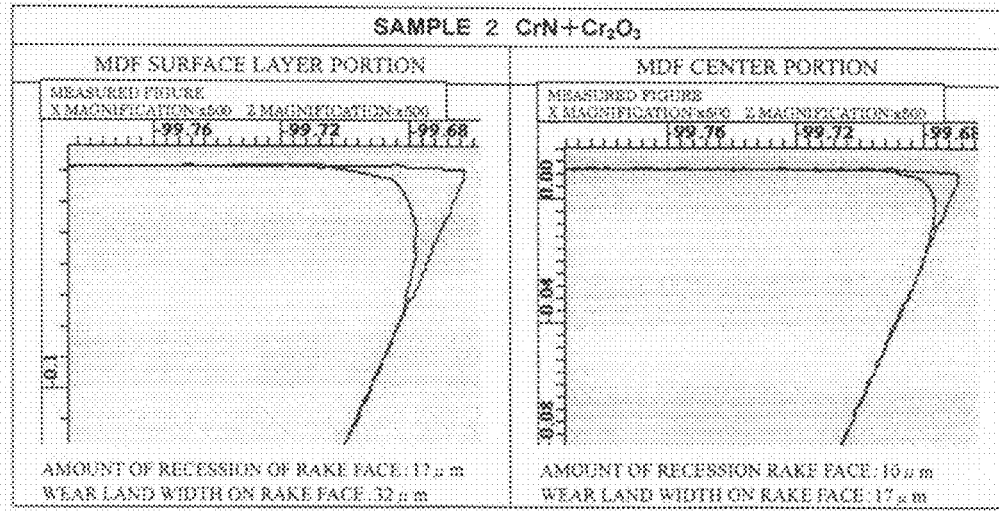

Fig. 14
(a)
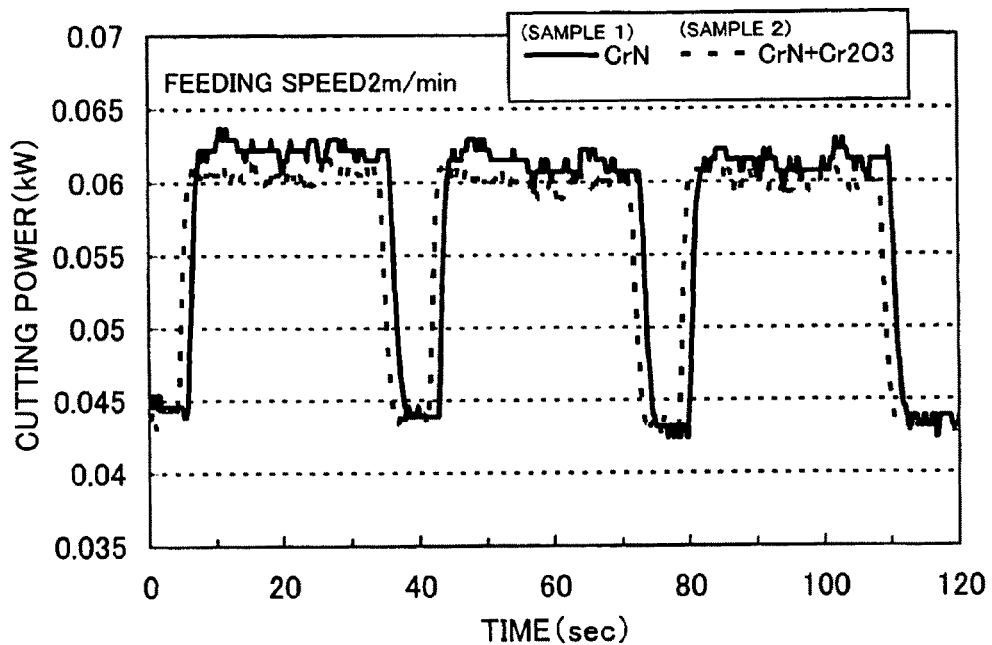
(b)
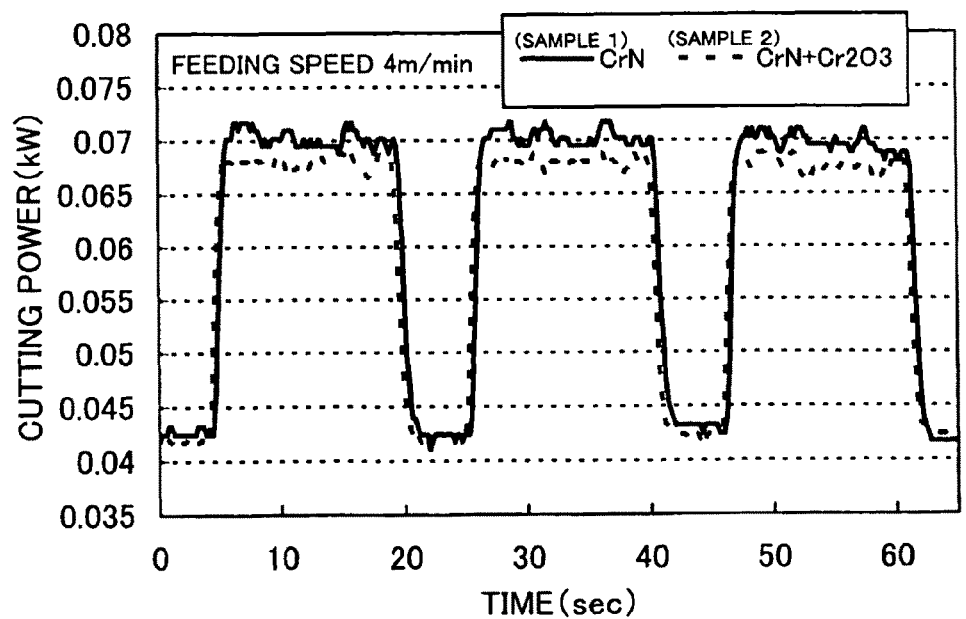

WOOD CUTTING TOOL

TECHNICAL FIELD

The present invention relates to a wood cutting tool, and, more particularly, to a wood cutting tool which is used in cutting and crushing woods and wood based materials, and has a hard fundamental layer of chromium or chromium nitride formed on at least a rake face or a clearance face.

BACKGROUND ART

A crushing blade for crushing a wood and a composite material of a wood based material, a rotary cutting tool, such as a circular saw blade, which is used in a cutting work, and other planing tools, such as a planer knife, selectively use a bearing steel, tool steel, cemented carbide alloy or the like as its substrate. It is popular to perform a process, such as PVD, of applying a hard fundamental layer containing chromium nitride (CrN) to the rake faces or clearance faces of the wood cutting tools, such as the crushing blade and the cutting blade, for the purpose of improving the sharpness, and the lasting and improved cutting life thereof.

For example, Patent Literature 1 has proposed formation of a chromium nitride hard fundamental layer on either the clearance face or the rake face of a wood cutting tool having a high speed tool steel, a cemented carbide alloy or the like as the substrate thereof to thereby suppress aging-dependent wearing of the cutting edge.

CITATION LIST

Patent Literature
Patent Literature 1: Japanese Patent Application Laid-Open No. H2-252501

SUMMARY OF INVENTION

Problem to be Solved by the Invention

Because of growing interests on environment, it is the recent tendency to further improve the durability of wood cutting tools and ensure longer life thereof, so that it is expected to significantly improve the wear resistance and corrosion resistance of wood cutting tools. While wood cutting tools coated with a hard fundamental layer of chromium nitride as in the related art demonstrate an excellent effect on dried wood based materials, but not on work piece materials with a high moisture content. That is, as the moisture content of a work piece material becomes higher, the dissolution of the chromium component of the hard fundamental layer is accelerated, leading to the difficulty such that the amount of wear (the amount of recession of cutting edge) originated from corrosion increases.

In consideration of the inherent problem of the conventional wood cutting tools, therefore, it is an object of the present invention to provide a wood cutting tool with improved wear resistance and corrosion resistance against woods and wood based materials regardless of the dry state thereof.

Means for Solving the Problem

To overcome the problem and achieve the object, according to one aspect of the invention, there is provided a wood cutting tool having a hard fundamental layer containing a chromium material and/or chromium nitride material and coated directly or indirectly on at least a rake face or a clearance face of a substrate formed of a cemented carbide alloy, a bearing steel or a tool steel, wherein the hard fundamental layer is coated directly or indirectly with a hard main layer containing a chromium oxide material.

EFFECT OF THE INVENTION

The wood cutting tool according to the present invention improves wear resistance and corrosion resistance against woods and wood based materials regardless of the moisture content thereof, thereby prolonging the product life.

BRIEF DESCRIPTION OF DRAWINGS

[FIG. 1] A diagram showing a cemented carbide replaceable knife according to a first embodiment, FIG. 1(a) presenting a general view of the cemented carbide replaceable knife as viewed from the rake face side while FIG. 1(b) presents a cross-sectional view along line A-A in FIG. 1(a).

[FIG. 2] A diagram showing a cemented carbide replaceable knife according to a second embodiment, FIG. 2(a) presenting a general view of the cemented carbide replaceable knife as viewed from the rake face side while FIG. 2(b) presents a cross-sectional view along line B-B in FIG. 2(a).

[FIG. 3] A diagram showing a planer knife according to a third embodiment, FIG. 3(a) presenting a cross-sectional view of a cemented carbide replaceable knife having a thin hard main layer formed thereon while FIG. 3(b) presents a cross-sectional view of the planer knife having a thick hard main layer formed thereon.

[FIG. 12] A cross-sectional view of edges of samples 1 and 2 showing experimental results of Experimental Example 8.

[FIG. 14] A graph showing experimental results of comparison of cutting power in Experimental Example 9, FIG. 14(a) showing the case of the feed speed of 2 in/min while FIG. 14(b) shows the case of the feed speed of 4 m/min.

BEST MODE FOR CARRYING OUT THE INVENTION

Figure 4:
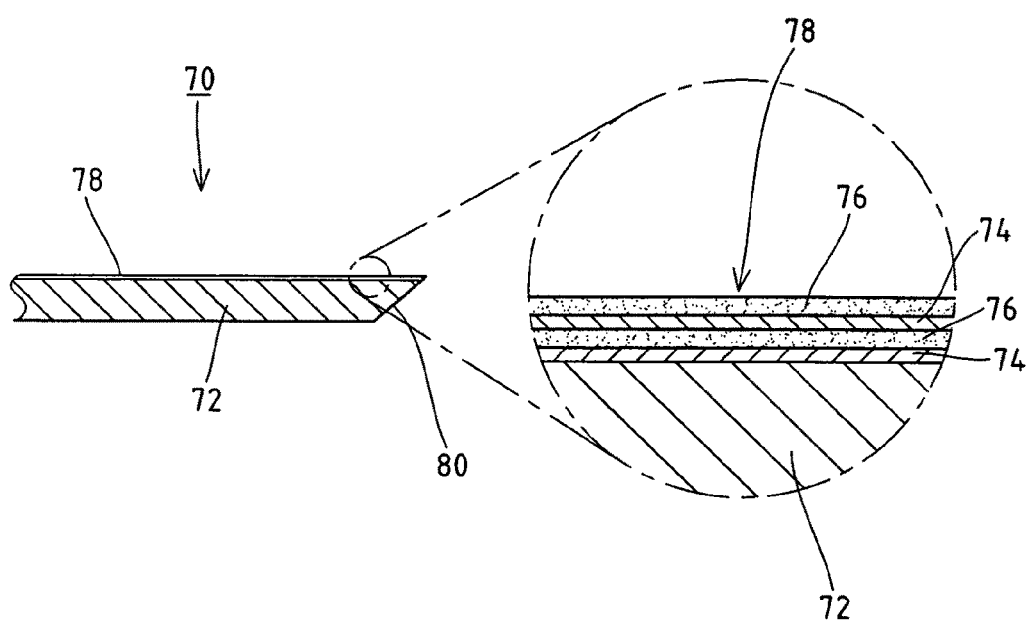
[FIG. 4] A cross-sectional view showing a cemented carbide replaceable knife according to a modification.

A wood cutting tool according to the present invention will now be described by way of preferred embodiments with reference to the accompanying drawings.

First Embodiment

FIG. 1(a) is a general view of a wood cutting tool 10 according to a first embodiment as viewed from the side of a rake face 16, and FIG. 1(b) is a cross-sectional view of the wood cutting tool 10 along line A-A. According to the first embodiment, a cemented carbide replaceable knife 10 provided at a milling cutter with replaceable knife, a router bit with replaceable knife or the like is adopted as the wood cutting tool. This cemented carbide replaceable knife 10 has a thin plate-like substrate 12 made of a cemented carbide alloy as its body, and cutting edge portions 14, 14 formed at both lengthwise edge portions of the substrate 12, so that with the cemented carbide replaceable knife 10 inverted, both cutting edge portions 14, 14 can be used in cutting. As shown in enlargement in FIG. 1(b), a hard fundamental layer 18 containing chromium nitride (CrN) is coated on the rake face 16 by PVD. The hard fundamental layer 18 has, for example, a five-layer structure of a first layer 18a to a fifth layer 18e with the first layer 18a deposited on the substrate 12 side.

The entire thickness of the hard fundamental layer 18 is set in a range of about 0.075 μm to 10.0 μm. When the hard fundamental layer 18 is thinner than 0.075 μm, it cannot adequately protect the substrate 12, and it becomes difficult to secure the adhesion to a hard main layer 20 (to be described later) as shown in experimental examples to be described later. When the thickness of the hard fundamental layer 18 is greater than 10.0 μm, chipping of the hard fundamental layer 18 is likely to occur at the time of cutting or sharpening (blade polishing). At the time of sharpening, the hard fundamental layer 18 is ground to remove a clearance face 22 of the substrate 12, so that the hard fundamental layer 18 remains as a cross section at the clearance face 22 at the cutting edge portion, but does not remain as a coat.

The hard main layer 20 containing a chromium oxide material (Cr—O) is coated on the outer surface of the fifth layer 18e which is the outermost layer of the hard fundamental layer 18. The hard main layer 20 comprises a thin layer of chromium oxide ($Cr_2O_3$). According to the first embodiment, the hard main layer 20 is formed by a single layer whose thickness is set in a range of about 0.2 μm to 5.0 μm. When the thickness of the hard main layer 20 becomes smaller than 0.2 μm, wear resistance and corrosion resistance cannot be improved as shown in the experimental examples to be described later. When the thickness of the hard main layer 20 is set greater than 5.0 μm, chipping of the hard main layer 20 is likely to occur at the time of cutting or sharpening. Further coating of the hard main layer 20 on the hard fundamental layer 18 demonstrates favorable wear resistance and corrosion resistance against woods and wood based materials regardless of the dry state thereof. The hard main layer 20 is also ground at the time of sharpening, so that the hard main layer 20 remains as a cross section at the clearance face 22 at the cutting edge portion, but does not remain as a coat. Although the hard fundamental layer 18 is made to have a five-layer structure, and the hard main layer 20 is made to be a single layer in the first embodiment, this layer structure is not restrictive, and the hard fundamental layer 18 may have four or less or six or more layers, and the hard main layer 20 may have two or more layers.

Second Embodiment

Next, a second embodiment of a wood cutting tool will be described below. FIG. 2(a) is a general view of a wood cutting tool 30 according to the second embodiment as viewed from the side of a rake face 34, and FIG. 2(b) is a cross-sectional view along line B-B. Similar to the first embodiment, a cemented carbide replaceable knife 30 provided at a milling cutter with replaceable knife, a router bit with replaceable knife or the like is adopted as the wood cutting tool according to the second embodiment. This cemented carbide replaceable knife 30 has a substrate 32 made of a cemented carbide alloy, and has a hard fundamental layer 36 of chromium nitride coated on the rake face 34 of the substrate 32. The hard fundamental layer 36 has, for example, a two-layer structure (a first layer 36a and a second layer 36b from the substrate 32 side).

A hard main layer 38 of chromium oxynitride (CrNO) is coated on the outer surface of the second layer 36b which is the outermost layer of the hard fundamental layer 36. The hard main layer 38 has, for example, three-layer structure in which a first layer 38a to be coated on the hard fundamental layer 36 is formed of chromium oxynitride and coated by PVD at an oxygen concentration of 5% under the atmosphere of oxygen and nitrogen gases. A second layer 38b to be deposited on the first layer 38a, and an outermost third layer 38c are both formed of chromium oxynitride and coated by PVD at an oxygen concentration of 10% under the atmosphere of oxygen and nitrogen gases. That is, according to the second embodiment, the hard main layer 38 is formed by plural laminates of chromium oxynitride layers with different oxygen concentrations. The entire thickness of the hard fundamental layer 36 is set in a range of about 0.075 μm to 10.0 μm as per the first embodiment, and the entire thickness of the hard main layer 38 is also set in a range of about 0.2 μm to 5.0 μm. Because of being ground at the time of sharpening, the hard fundamental layer 36 and the hard main layer 38 also remain as cross sections at a clearance face 40 of the substrate 32 at the cutting edge portion, but do not remain as coats. Although the hard fundamental layer 36 is made to have a two-layer structure, and the hard main layer 38 is made to have a three-layer structure, these layer structures may be changed as needed.

Third Embodiment

Next, wood cutting tools 50, 51 according to a third embodiment will be described below. According to the third embodiment, as shown in FIGS. 3(a) and 3(b), two types of planer knives 50, 51 are adopted as a wood cutting tool. A substrate 52 of the planer knife 50, 51 is formed of a high speed tool steel, and has a rake face 54 on which a single hard fundamental layer 56 of chromium nitride is coated by PVD. Hard main layers 58, 60 with different thicknesses are coated, one each, on the hard fundamental layers 56, 56 of both planer knives 50, 51. The hard main layers 58, 60 are formed of chromium oxide ($Cr_2O_3$) as per the first embodiment.

In the planer knife 50 having the thin hard main layer 58 (see FIG. 3(a)), the thickness of the hard fundamental layer 56 is set to about 2.2 μm, and the thickness of the hard main layer 58 is set to about 0.4 μm. In the planer knife 51 having the thick hard main layer 60 (see FIG. 3(b)), the thickness of the hard fundamental layer 56 is set to about 2.3 μm, and the thickness of the hard main layer 60 is set to about 0.7 μm. It is to be noted that the thickness of each hard main layer 58, 60 can be changed within a range of 0.2 μm to 5.0 μm. The thickness of each hard fundamental layer 56, 56 can be changed within a range of 0.075 μm to 10.0 μm. Since the planer knife 50, 51 is sharpened again to be reused as a clearance face 62, 62 is polished again, the hard fundamental layer 56 and the hard main layer 58, 60 are not coated on the clearance face 62, 62 of the planer knife 50, 51. The layer structure of each layer 56, 58, 60 according to the third embodiment is not restrictive, and can be changed as needed.

(Modifications)

The layer structures of the hard fundamental layer and the hard main layer are not, limited to those of the foregoing embodiments illustrated. For example, hard fundamental layers and hard main layers may be alternately laminated into plural laminates. FIG. 4 is a cross-sectional view showing a wood cutting tool 70 according to a modification. This wood cutting tool is a cemented carbide replaceable knife 70 to be used for a milling cutter with replaceable knife, a router bit with replaceable knife or the like. The cemented carbide replaceable knife 70 has a substrate 72 formed of a cemented carbide alloy as its body. As shown in enlargement in FIG. 4, hard fundamental layers 74 and hard main layers 76 are alternately laminated into plural laminates on a rake face 78 of the substrate 72. That is, the hard fundamental layer 74 of chromium nitride (CrN) is formed on the rake face 78 of the substrate 72 as a first layer, and the hard main layer 76 of chromium oxide ($Cr_2O_3$) is formed on the top surface of this hard fundamental layer 74 as a second layer. Further, the hard fundamental layer 74 of chromium nitride is formed as a third layer on which the hard main layer 76 of chromium oxide is coated as an outermost fourth layer.

Although the hard fundamental layers and hard main layers are alternately laminated into plural laminates in the above modification shown in FIG. 4, each layer has a single-layer structure. However, it is not essential that each layer has a single-layer structure, and each layer may have a multi-layer structure. In addition, all of the hard fundamental layers and the hard main layers should not necessarily have a multi-layer structure, and a single layer and a multilayer may be alternately laminated, or may be combined at random without regularity.

For example, though not illustrated, such is a case where hard fundamental layers each having a multilayer of chromium nitride (CrN) and hard main layers each having a multilayer of chromium oxide ($Cr_2O_3$) are alternately laminated into plural laminates on the rake face 78 of the substrate 72. As mentioned above, every one of the hard fundamental layers and the hard main layers should not necessary have a multi-layer structure, and only specific layers may have a multi-layer structure.

Further, when a layer of chromium oxide ($Cr_2O_3$) has a multi-layer structure, the oxygen concentrations may differ in the first layer, the second layer, the third layer, . . . . That is, PVD coating of a chromium oxide on the first layer, the second layer, the third layer, . . . may be carried out in such a way that the oxygen concentration in the atmosphere of oxygen and chromium gases at the time of PVD coating may be made different for the individual layers.

In the cemented carbide replaceable knife 70 according to the modification, the total thickness of all the hard fundamental layers 74 and hard main layers 76 is set to be about 15.0 μm or less. This is because when the total thickness becomes greater than 15.0 μm, chipping is likely to occur at the time of cutting or sharpening. With the hard fundamental layers 74 and the hard main layers 76 alternately laminated, even if chipping occurs at the time of cutting or sharpening, the hard fundamental layer 74 or the hard main layer 76 is merely separated in the unit of a layer, and occurrence of large (deep) chipping can be suppressed. The layer structure according to the modification also can demonstrate excellent wear resistance and corrosion resistance similar to those of the first to third embodiments. It is to be noted that because of being ground at the time of sharpening, the hard fundamental layer 74 and the hard main layer 76 remain as cross sections at a clearance face 80 of the substrate 72 at the cutting edge portion, but do not remain as coats.

Although chromium nitride (CrN) is used as a layer composition of the hard fundamental layers 18, 36, 56, 74 in the first to third embodiments and the modification, besides the chromium nitride as well as CrBN, CrCN, CrAlN, CrSiN, CrTiN or the like can be used for the hard fundamental layer as long as it contains an oxide-free chromium (Cr) and/or chromium nitride material. Further, although descriptions of the first to third embodiments and the modification have been given of the example where the cemented carbide replaceable knife 10, 30, 70 or the planer knife 50, 51, such as a milling cutter with replaceable knife or a router bit with replaceable knife, serves as a wood cutting tool, the wood cutting tool may be any of a chipper knife, a tipped saw blade, a finger joint cutter, etc. as long as it is a crushing blade or a cutting blade for woods or wood based materials. Further, although the hard fundamental layer 18, 36, 56, 74 and the hard main layer 20, 38, 58, 60, 76 are formed on the rake face 16, 34, 54, 78 in the first to third embodiments and the modification, the layers may be formed on the clearance face 22, 40, 62, 80, or on both the rake face 16, 34, 54, 78 and the clearance face 22, 40, 62, 80. In case of a crushing blade, particularly, it is desirable to coat the layers on both of the rake face and the clearance face. Furthermore, both layers can be coated on the entire substrate 12, 32, 52, 72.

To check the cutting performances of the wood cutting tools according to the present invention, cutting tests were conducted on samples with various layer structures which were prepared for various wood cutting tools. At the time of preparing the samples, PVD was carried out using an arc discharge type ion plating device (not shown) to form a hard fundamental layer with a single-layer structure or a multi-layer structure on the substrate of a cemented carbide alloy or high speed tool steel. Then, a hard main layer of chromium oxide ($Cr_2O_3$) or chromium oxynitride (CrNO) was coated on the substrate of the cemented carbide alloy or high speed tool steel in such a way as to have a single-layer structure or a multi-layer structure. Coating was performed on the rake face of the substrate in Experimental Examples 1 to 7, coating was performed on the rake face and clearance face of the substrate in Experimental Example 8, and coating was performed on the clearance face of the substrate in Experimental Example 9. The following are the treatment conditions.

Evaporation source: chromium (Cr)
Arc discharge current: 150 A
Bias voltage: −40 to −100 V
Internal chamber pressure: 2.66 Pa
Substrate temperature: 400° C.

EXPERIMENTAL EXAMPLE 1

In Experimental Example 1, an experiment was conducted to check the effects on wear resistance and corrosion resistance in case of coating the hard main layer of chromium oxide. That is, a cemented carbide replaceable knife (sample 1) coated only with the hard fundamental layer, and a cemented carbide replaceable knife (sample 2) coated with the hard fundamental layer and the hard main layer were prepared and subjected to a cutting test. The layer structures of the samples 1 and 2 are given below. The film types of the individual samples were analyzed by an energy dispersive spectrometer (as done in the following experimental examples). For the cemented carbide replaceable knife of every sample, the total thickness of the coated layers was set in a range of 7.0 μm to 7.5 μm. In addition, the substrate in every sample had a size of 20 mm×12 mm×1.5 mm.

TABLE 1

| Sample No. | Film Type | | Layer Structure |
|---|---|---|---|
| 1 | CrN | 5 layers | all are CrN layers |
| 2 | CrN + CrO | 5 layers + 1 layer | hard fundamental layer first to fifth layers: CrN layer hard main layer first layer: $Cr_2O_3$ |

Using the samples 1 and 2, cutting tests were conducted on Japanese cedar as a work piece material. The following are the cutting conditions.
Machine: NC router
Work piece material: Japanese cedar (moisture content of 30 to 80%)
Cutting tool: router bit (cutting diameter of 45 mm)
Feeding speed: 1 m/min
Rotational speed: 6000 RPM
Depth of cut: 20 mm
Cutting length of work piece: 77.5 m The results of the above experiment are as follows.

TABLE 2

| Sample No. | Amount of recession of cutting edge (rake face) | Wear land width on rake face |
|---|---|---|
| 1 | 20.6 μm | 26.6 μm |
| 2 | 11.7 μm | 2.0 μm |

Figure 5:
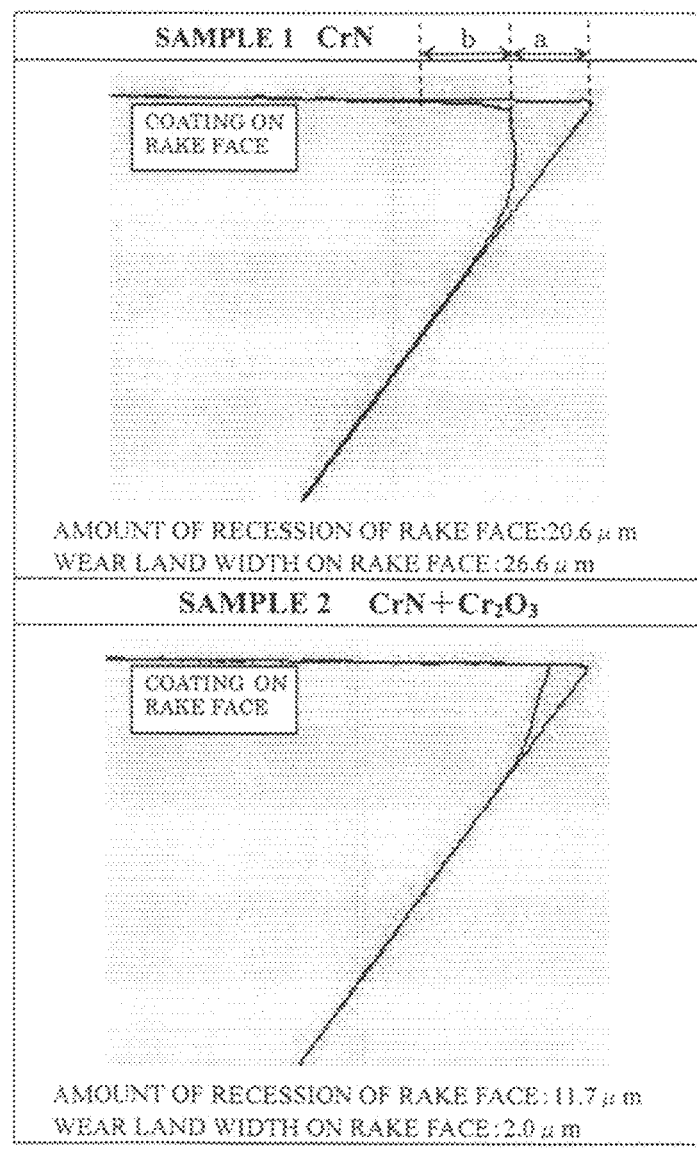
[FIG. 5] A cross-sectional view of edges of samples 1 and 2 showing experimental results of Experimental Example 1.

FIG. 5 shows the cross-sectional shape of the edge of each sample after cutting 77.5 m. The amount of recession of rake face and the wear land width on rake face are the amounts of wear respectively indicated by reference numeral a and reference numeral b in FIG. 5 (the same is true of the following Experimental Examples 1 to 8).

It is apparent from the above experimental results that the sample 1 which is not coated with the hard main layer has a larger amount of recession of cutting edge, and the sample 2 which is coated with the hard main layer has a smaller amount of recession of cutting edge. In addition, the sample 1 shows larger wear land width on rake face, and the sample 2 shows a very small value thereof. FIG. 5 shows that the hard fundamental layer on the rake face is worn to have a round cross section in the sample 1, whereas the layers (hard fundamental layer and hard main layer) on the rake face remain to keep a sharp cross section in the sample 2. It is apparent from the results of this experimental example that the cemented carbide replaceable knife according to the sample 2 coated with the hard main layer demonstrates very good wear resistance and corrosion resistance.

EXPERIMENTAL EXAMPLE 2

Next, a cutting test was conducted on a sample 3 coated with a thick hard main layer (chromium oxide) in addition to the samples 1 and 2 in the Experimental Example 1. While the thickness of the hard main layer in the sample 2 is about 0.7 μm, the thickness of the hard main layer in the sample 3 is about 2.0 μm. The layer structures of the samples 1 to 3 are given below. In every sample, the total thickness is set in a range of about 7.0 μm to 7.5 μm, and the substrate has a size of 20 mm×12 mm×1.5 mm.

TABLE 3

| Sample No. | Film Type | Layer Structure | |
|---|---|---|---|
| 1 | CrN | 5 layers | all are CrN layers |
| 2 | CrN + CrO | 5 layers + 1 layer | hard fundamental layer first to fifth layers: CrN layer hard main layer first layer: $Cr_2O_3$ (0.7 μm) |
| 3 | CrN + CrO | 4 layers + 1 layer | hard fundamental layer first to fourth layers: CrN layer hard main layer first layer: $Cr_2O_3$ (2.0 μm) |

Using the samples 1 to 3, cutting tests were conducted on hinoki (Japanese cypress) having a high moisture content. The following are the cutting conditions.
Machine: NC router
Work piece material: hinoki (Japanese cypress) (moisture content of 50 to 90%)
Cutting tool: router bit (cutting diameter of 45 mm)
Feeding speed: 1 m/min
Rotational speed: 6000 RPM
Depth of cut: 20 mm
Cutting length of work piece: 30 m The results of the above experiment are as follows.

TABLE 4

| Sample No. | Amount of recession of cutting edge (rake face) | Wear land width on rake face |
|---|---|---|
| 1 | 17.0 μm | 18.4 μm |
| 2 | 12.0 μm | 4.3 μm |
| 3 | 5.7 μm | 2.5 μm |

Figure 6:
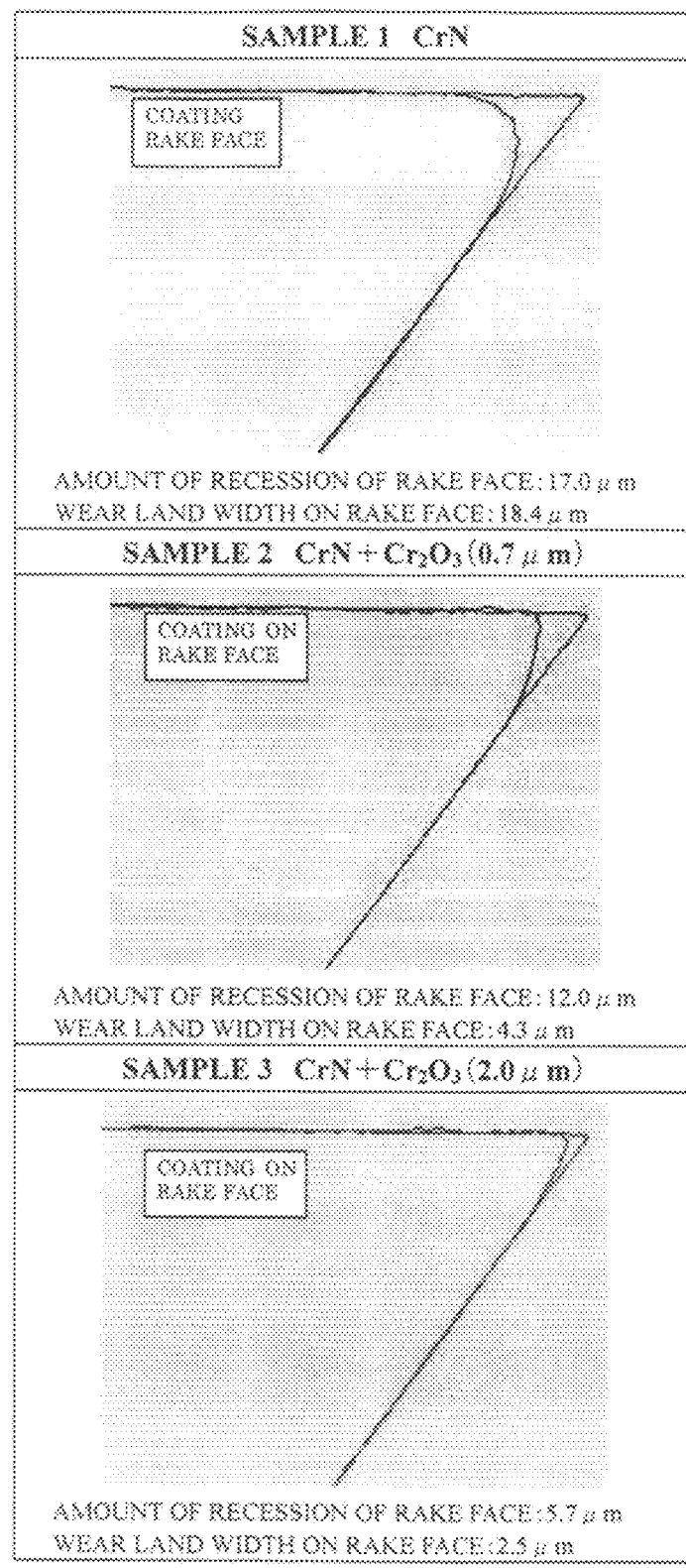
[FIG. 6] A cross-sectional view of edges of samples 1 to 3 showing experimental results of Experimental Example 2.

FIG. 6 shows the cross-sectional shape of the edge of each sample after cutting 30 m.

It is apparent from the above experimental results that the samples 2 and 3 where the hard main layer is formed have a smaller amount of recession of cutting edge and smaller wear land width on rake face. In particular, the sample 3 where the thickness of the hard main layer was made larger showed the smallest values. FIG. 6 shows that the hard fundamental layer on the rake face is worn to have a round cross section in the sample 1, whereas the layers (hard fundamental layer and hard main layer) on the rake face remain to keep a sharp cross section in the samples 2 and 3. It is apparent from the results of the Experimental Example 2 that the cemented carbide replaceable knives according to the samples 2 and 3 coated with chromium oxide demonstrate very good wear resistance and corrosion resistance even for work piece materials with a high moisture content. In addition, it can be said that the larger the thickness of the hard main layer is, the greater the improvements on the wear resistance and corrosion resistance are.

EXPERIMENTAL EXAMPLE 3

In Experimental Example 3, a comparison experiment was conducted using a chromium oxynitride (sample 2, 3) or chromium oxide (sample 4) as the hard main layer. With regard to the sample using chromium oxynitride, two kinds of samples (samples 2, 3) with different oxygen concentrations in the atmosphere of oxygen and nitrogen gases at the time of forming the hard main layer were prepared. Further, for the purpose of comparison, a cemented carbide replaceable knife coated only with the hard fundamental layer was prepared (sample 1). The layer structures of the samples 1 to 4 to be used in this experimental example are given below. In every sample, the total thickness is set in a range of about 7.0 μm to 7.5 μm, and the substrate has a size of 20 mm×12 mm×1.5 mm.

TABLE 5

| Sample No. | Film Type | Layer Structure | |
|---|---|---|---|
| 1 | CrN | 5 layers | all are CrN layers |
| 2 | CrN + CrNO ($O_2$ 20%) | 4 layers + 1 layer | hard fundamental layer first to fourth layers: CrN layer hard main layer |

TABLE 5-continued

| Sample No. | Film Type | Layer Structure | |
|---|---|---|---|
| 3 | CrN + CrNO (O$_2$ 30%) | 4 layers + 1 layer | first layer: CrNO (N$_2$ 80%, O$_2$ 20%) thickness about 1.4 µm hard fundamental layer first to fourth layers: CrN layer hard main layer first layer: CrNO (N$_2$ 70%, O$_2$ 30%) thickness about 1.4 µm |
| 4 | CrN + CrO | 5 layers + 1 layer | hard fundamental layer first to fifth layers: CrN layer hard main layer first layer: Cr$_2$O$_3$ (N$_2$ 50%, O$_2$ 50%) thickness about 0.7 µm |

Using the samples 1 to 4, cutting tests were conducted on a dried spruce laminated wood.

The following are the cutting conditions.
Machine: NC router
Work piece material: spruce laminated wood
Cutting tool: router bit (cutting diameter of 45 mm)
Feeding speed: 1 m/min
Rotational speed: 6000 RPM
Depth of cut: 20 mm
Cutting length of work piece: 90 m The results of the above experiment are as follows.

TABLE 6

| Sample No. | Amount of recession of cutting edge (rake face) | Wear land width on rake face |
|---|---|---|
| 1 | 12.6 µm | 4.0 µm |
| 2 | 9.0 µm | 4.2 µm |
| 3 | 6.7 µm | 3.2 µm |
| 4 | 8.7 µm | 3.0 µm |

Figure 7:
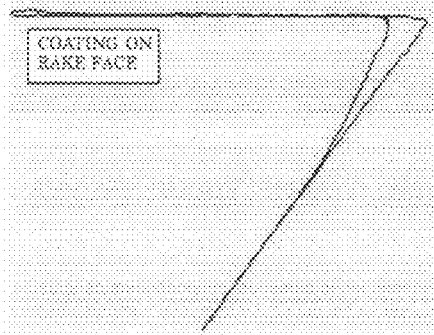
[FIG. 7] A cross-sectional view of edges of samples 1 to 4 showing experimental results of Experimental Example 3.

FIG. 7 shows the cross-sectional shape of the edge of each sample after cutting 90 m.

It is apparent from the above experimental results that the sample 1 which is not coated with the hard main layer has the largest amount of recession of cutting edge, and the samples 2 to 4 have small amounts of recession of cutting edge. In case of the samples 2, 3 where the hard main layer of the same chromium oxynitride is coated, the sample 3 where the oxygen concentration in the gas atmosphere at the time of PVD coating is high has a smaller amount of recession of cutting edge and smaller wear land width on rake face. In addition, the sample 4 shows the smallest value of the wear land width on rake face. FIG. 7 shows that while any one of the samples 1 to 4 maintains a sharp shape, the samples 3 and 4, in particular, show very sharp cross-sectional shapes remaining. It is apparent from the results of the Experimental Example 3 that the cemented carbide replaceable knives coated with the hard main layer of chromium oxynitride or chromium oxide demonstrate very good wear resistance and corrosion resistance for dried materials. In addition, in case where the hard main layer of chromium oxynitride is coated, it is apparent that the higher the oxygen concentration is, the greater the improvements on the wear resistance and corrosion resistance are.

It is apparent from the results of the Experimental Examples 1 to 3 that the cemented carbide replaceable knives coated with the hard main layer of chromium oxide demonstrate excellent wear resistance and corrosion resistance for both of work piece materials with a high moisture content and dried work piece materials. It is also apparent that the cemented carbide replaceable knives coated with the hard main layer of chromium oxynitride demonstrate excellent wear resistance and corrosion resistance for dried work piece materials. What is more, it was confirmed that in case of coating chromium oxynitride, the wear resistance and corrosion resistance would be improved according to the oxygen concentration.

EXPERIMENTAL EXAMPLE 4

A cutting test was conducted using the cemented carbide replaceable knives having the substrate of a cemented carbide alloy in the Experimental Examples 1 to 3, whereas a cutting test was conducted using the planer knife having the substrate formed of a high speed tool steel in the Experimental Example 4. At the time of preparing samples, a hard fundamental layer of chromium nitride (CrN) is formed on the rake face of the substrate formed of a high speed tool steel using an arc discharge type ion plating device as per the Experimental Examples 1 to 3. Then, a hard main layer of chromium oxide (Cr$_2$O$_3$) was coated on the hard fundamental layer under the following conditions in such a way as to have different thicknesses, thus preparing two kinds of samples (samples 2 and 3). Further, for the purpose of comparison, a sample (sample 1) coated only with the hard fundamental layer was prepared. The layer structures of the samples 1 to 3 to be used in this experiment example are given below.

TABLE 7

| Sample No. | Film Type | Layer Structure | Thickness |
|---|---|---|---|
| 1 | CrN | CrN | 3.0 µm |
| 2 | CrN + CrO | CrN + Cr$_2$O$_3$ | 2.2 + 0.4 µm |
| 3 | CrN + CrO | CrN + Cr$_2$O$_3$ | 2.3 + 0.7 µm |

Using the samples 1 to 3, cutting tests were conducted on dried spruce. The following are the cutting conditions.
Machine: NC horizontal spindle cutting machine
Work piece material: dried spruce
Cutting tool: milling cutter (cutting diameter of 125 mm)
Feeding speed: 5 m/min
Rotational speed: 6000 RPM
Depth of cut: 0.5 mm
Cutting length of work piece: 1000 m The results of the above experiment are as follows.

TABLE 8

| Sample No. | Amount of recession of cutting edge (rake face) | Wear land width on rake face |
|---|---|---|
| 1 | 8.9 µm | 4.3 µm |
| 2 | 5.0 µm | 1.7 µm |
| 3 | 4.6 µm | 1.4 µm |

Figure 8:
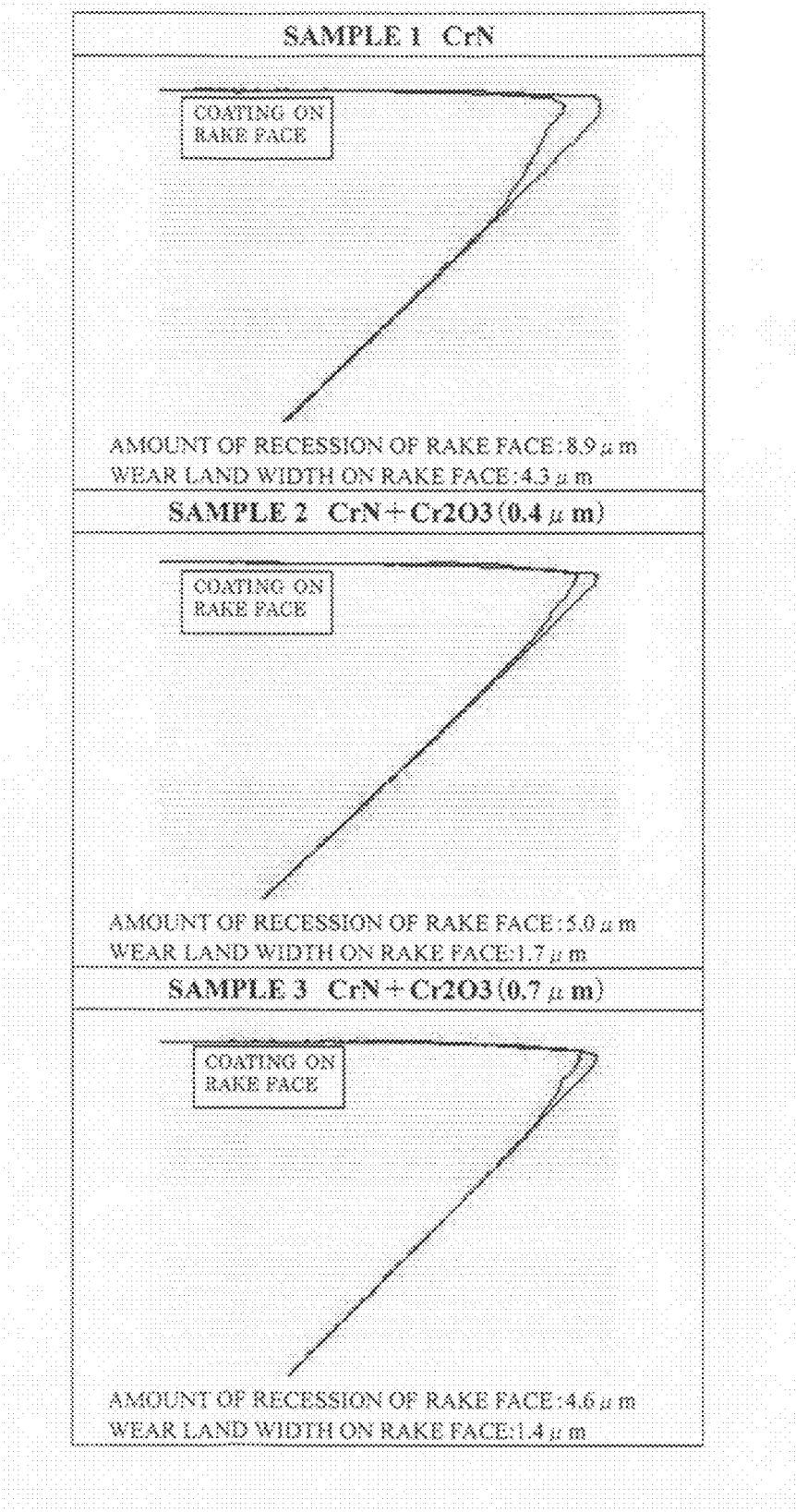
[FIG. 8] A cross-sectional view of edges of samples 1 to 3 showing experimental results of Experimental Example 4.

FIG. 8 shows the cross-sectional shape of the edge of each sample after the cutting test.

It is apparent from the above experimental results that the sample 1 without the hard main layer has the largest amount of recession of cutting edge, and the amount of recession of cutting edge becomes smaller for the samples 2 and 3 in order. In addition, the sample 1 has the largest wear land width on rake face, and the wear land width on rake face becomes smaller for the samples 2 and 3 in order. Note that it was confirmed that chipping occurred more in the sample 3 where the thickness of the hard main layer was large, than the sample 2. FIG. 8 shows that the samples 2 and 3 have very small amounts of recession of cutting edge, and have sharp cross-sectional shapes remaining. As apparent from the results of the Experimental Example 4, it was confirmed that the planer knife made of a substrate of a high speed tool steel demonstrated excellent wear resistance and corrosion resistance when coated with the hard main layer. It was also confirmed in this experimental example that the wear resistance and corrosion resistance would be improved in proportion to the thickness of the hard main layer.

EXPERIMENTAL EXAMPLE 5

Accordingly, in the Experimental Example 5, a cutting test was conducted with a plurality of samples prepared with different film thicknesses in order to check the favorable range of the thickness of the hard main layer. The samples to be used in this experimental example had a hard fundamental layer (chromium nitride) with a single-layer structure coated on a cemented carbide replaceable knife having a substrate made of a cemented carbide alloy, and then had a hard main layer of chromium oxide coated thereon in various thicknesses (samples 2 to 6). For the purpose of comparison, a cemented carbide replaceable knife coated only with the hard fundamental layer was prepared (sample 1). The layer structures of the samples 1 to 6 are given below. The total layer thickness of each sample was set to about 7.5 μm.

TABLE 9

| Sample No. | Film Type | Layer Structure | Thickness of $Cr_2O_3$ |
| --- | --- | --- | --- |
| 1 | CrN | CrN | — |
| 2 | CrN + CrO | CrN + $Cr_2O_3$ | 0.15 μm |
| 3 | CrN + CrO | CrN + $Cr_2O_3$ | 0.40 μm |
| 4 | CrN + CrO | CrN + $Cr_2O_3$ | 0.70 μm |
| 5 | CrN + CrO | CrN + $Cr_2O_3$ | 1.25 μm |
| 6 | CrN + CrO | CrN + $Cr_2O_3$ | 1.90 μm |

Using the samples 1 to 6, cutting tests were conducted on hinoki (Japanese cypress) having a high moisture content. The following are the cutting conditions.
Machine: NC router
Work piece material: hinoki (Japanese cypress) (moisture content of 50 to 90%)
Cutting tool: router bit (cutting diameter of 45 mm)
Feeding speed: 1 m/min
Rotational speed: 6000 RPM
Depth of cut: 20 mm
Cutting length of work piece: 30 m
The results of the above experiment are as follows.

TABLE 10

| Sample No. | Amount of recession of cutting edge (rake face) | Wear land width on rake face |
| --- | --- | --- |
| 1 | 18.4 μm | 24.0 μm |
| 2 | 20.2 μm | 21.5 μm |
| 3 | 16.8 μm | 6.4 μm |
| 4 | 15.6 μm | 7.0 μm |
| 5 | 6.0 μm | 2.3 μm |
| 6 | 7.0 μm | 5.3 μm |

Figure 9:
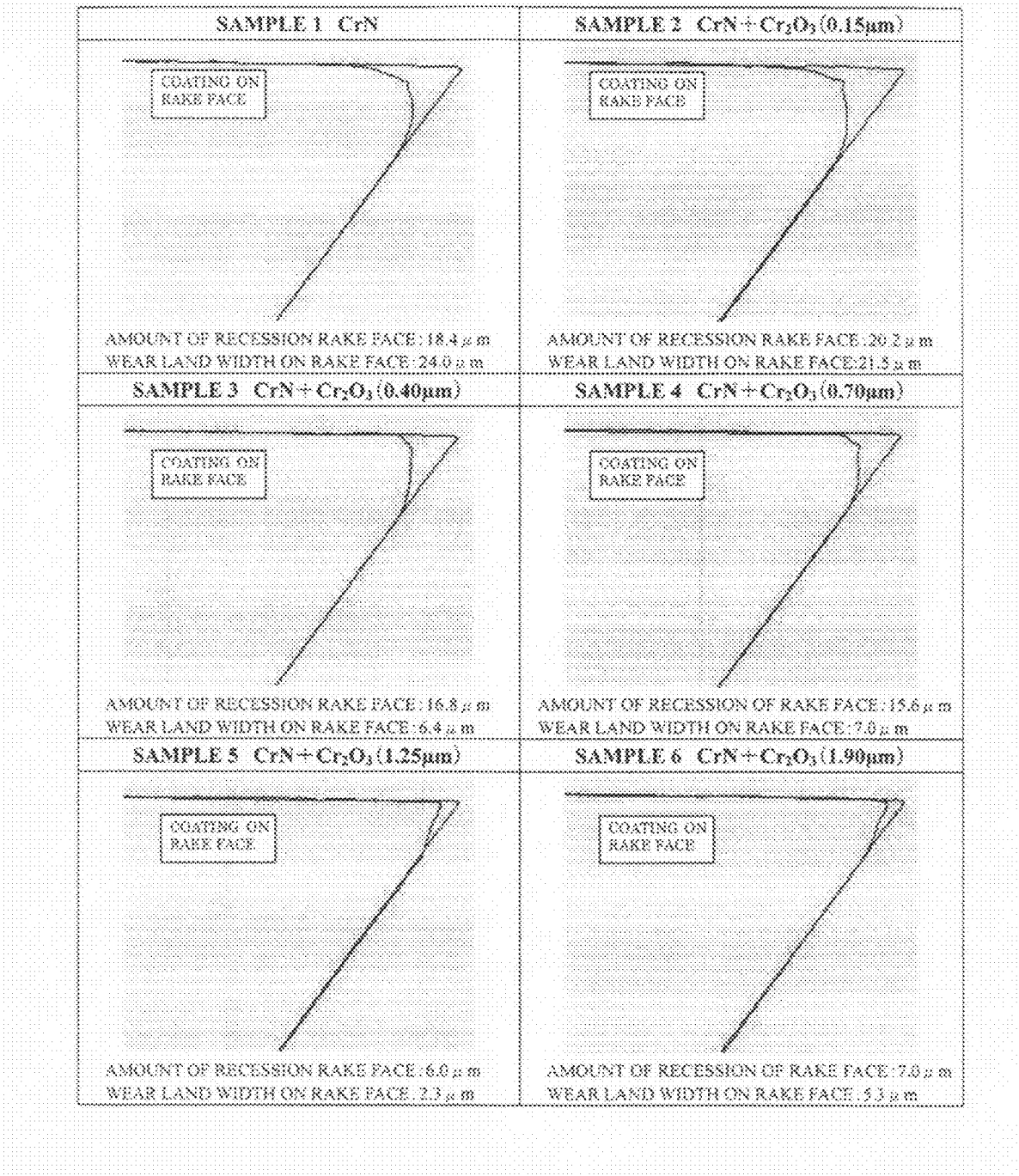
[FIG. 9] A cross-sectional view of edges of samples 1 to 6 showing experimental results of Experimental Example 5.

FIG. 9 shows the cross-sectional shape of the edge of each sample after the cutting test.

It is apparent from the above experimental results that each of the amount of recession of cutting edge and the wear land width on rake face becomes smaller as the thickness of the hard main layer becomes larger. In particular, as apparent from FIG. 9, the samples 5 and 6 have very sharp cross-sectional shapes remaining. It is also apparent that when the hard main layer is too small as in the sample 2, the amount of recession of cutting edge and the wear land width on rake face become large, so that the cross-sectional shape of the edge is rounded. Therefore, it seems that the hard main layer should have a certain thickness (at least about 0.2 μm or larger). It is to be noted that as the thickness of the hard main layer becomes larger, chipping is likely to occur at the time of cutting or sharpening, so that the favorable thickness of the hard main layer is set in a range of about 0.2 μm to 5.0 μm.

EXPERIMENTAL EXAMPLE 6

In the Experimental Example 6, an experiment was conducted to check the influence of the thickness of the hard fundamental layer on the adhesion of the hard main layer. In this experimental example, a hard fundamental layer of chromium nitride was coated on a cemented carbide replaceable knife, and then a hard main layer of chromium oxide was coated thereon. As samples, three kinds of cemented carbide replaceable knives having hard main layers with a constant thickness (4.0 μm) and hard fundamental layers with different thicknesses were prepared (samples 2 to 4). For the purpose of comparison, a cemented carbide replaceable knife having only a hard main layer (thickness of 4.0 μm) coated on the substrate was also prepared (sample 1). The layer structures of the samples 1 to 4 are given below.

TABLE 11

| Sample No. | Layer Structure | Thickness of CrN |
| --- | --- | --- |
| 1 | $Cr_2O_3$ | 0.0 μm |
| 2 | CrN + $Cr_2O_3$ | 0.037 μm |
| 3 | CrN + $Cr_2O_3$ | 0.075 μm |
| 4 | CrN + $Cr_2O_3$ | 0.150 μm |

Indentations provided by a Rockwell hardness tester using the samples 1 to 4 were observed, and the delamination area at the top surface of each sample was measured with a digital microscope. The results of the measurements are shown in a graph in FIG. 10.

Figure 10:
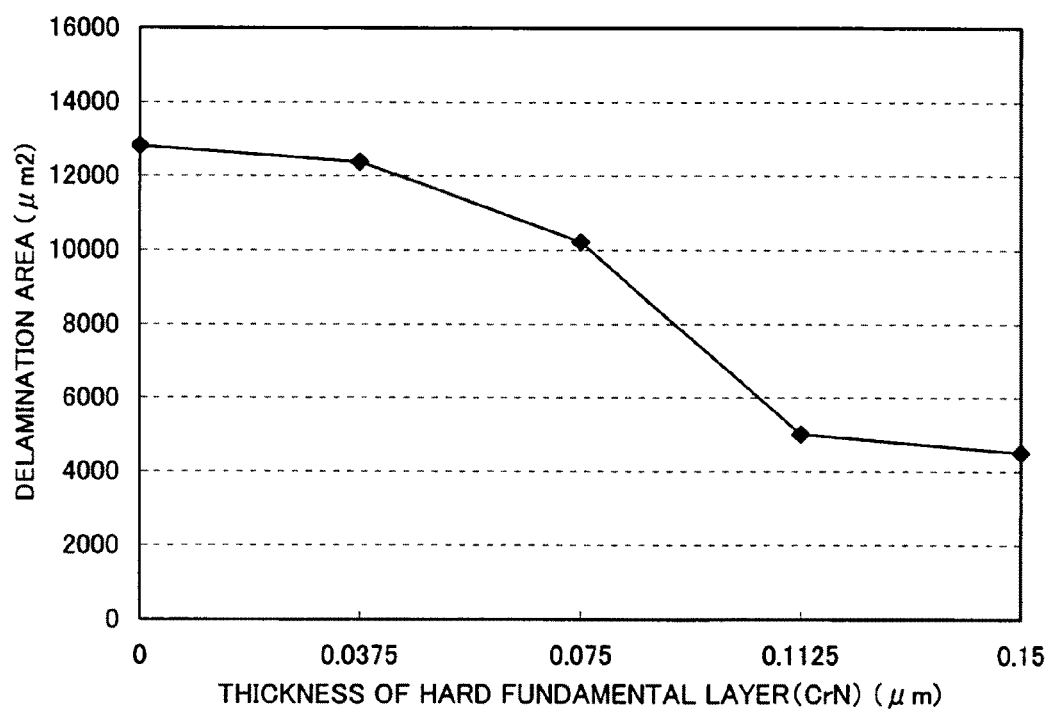
[FIG. 10] A graph showing experimental results of Experimental Example 6 and showing a delamination area vs. the thickness of a hard fundamental layer.

As shown in FIG. 10, it is apparent that the delamination area transits at high values and is not changed much when the thickness of the hard fundamental layer is in a range of 0.0 μm to 0.075 μm. It is, however, apparent that when the thickness exceeds 0.075 μm, the delamination area starts decreasing significantly. Therefore, it is desirable that the lower limit of the thickness of the hard fundamental layer be about 0.075 μm.

EXPERIMENTAL EXAMPLE 7

In the Experimental Example 7, an experiment was conducted to check the influence of the thickness of the hard fundamental layer on the chipping resistance (chipping). In this experimental example, five kinds of cemented carbide replaceable knives having only hard fundamental layers of chromium nitride formed on cemented carbide replaceable knives and with different thicknesses were prepared. The layer structures of the samples 1 to 5 are given below.

TABLE 12

| Sample No. | Layer Structure | Thickness of CrN |
| --- | --- | --- |
| 1 | CrN | 4.0 μm |
| 2 | CrN | 7.5 μm |
| 3 | CrN | 9.5 μm |

TABLE 12-continued

| Sample No. | Layer Structure | Thickness of CrN |
|---|---|---|
| 4 | CrN | 12.0 μm |
| 5 | CrN | 16.0 μm |

Figure 11:
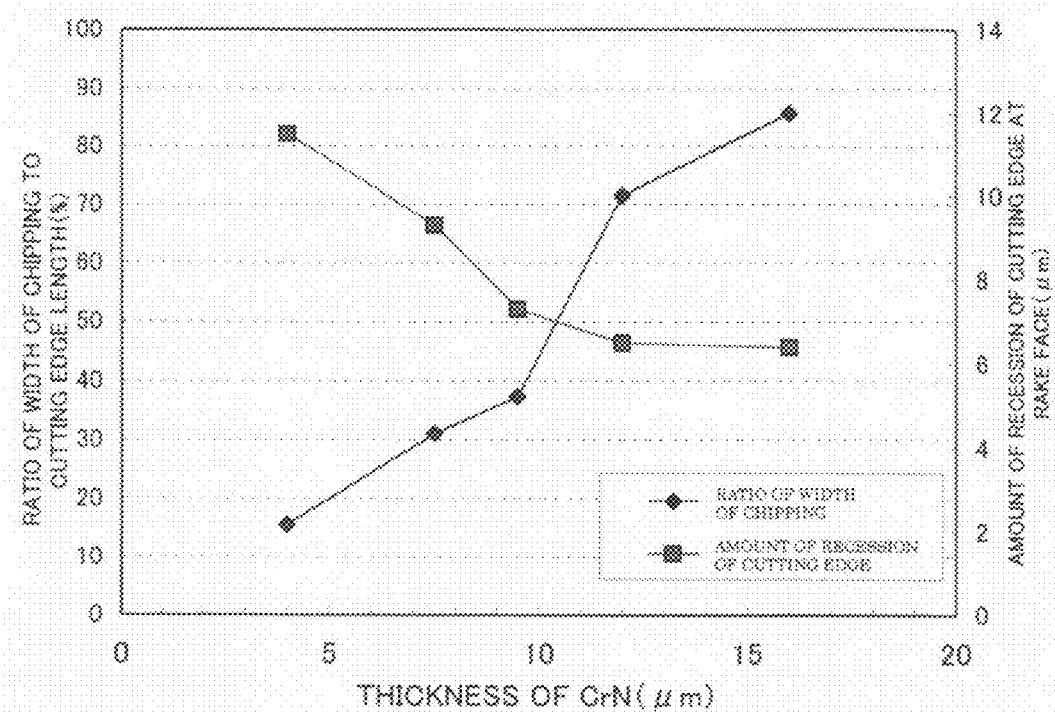
[FIG. 11] A graph showing experimental results of Experimental Example 7 and showing the ratio of a width of chipping and the amount of recession of cutting edge vs. the thickness of a hard fundamental layer.

Using the samples 1 to 5, cutting tests were conducted on a dried spruce laminated wood. The following are the cutting conditions.
Machine: NC router
Work piece material: spruce laminated wood
Cutting tool: router bit (cutting diameter of 45 mm)
Feeding speed: 1 m/min
Rotational speed: 6000 RPM
Depth of cut: 20 mm
Cutting length of work piece: 60 m The amount of recession of cutting edge on the rake face after the cutting test was measured for each sample. Further, the ratio of the width of chipping to the length of the cutting blade of each sample (length of the cutting edge used in cutting) was computed. The results are shown in a graph in FIG. 11. As apparent from FIG. 11, while the amount of recession of cutting edge becomes smaller in proportion to the thickness of the hard fundamental layer, the ratio of the width of chipping becomes larger in proportion to the layer thickness. In particular, it is apparent that when the thickness exceeds 10.0 μm, the ratio of the width of chipping sharply increases. When the amount of recession of cutting edge exceeds 10.0 μm, however, the degree of the reduction becomes smaller (the slope becomes gentler). Therefore, it is desirable that the thickness of the hard fundamental layer be about 10.0 μm or less.

From the results of the Experimental Examples 5 to 7, it is desirable that the thickness of the hard main layer should be set in a range of about 0.2 μm to 5.0 μm. It is also desirable that the thickness of the hard fundamental layer should be in a range of about 0.075 μm to 10.0 μm.

EXPERIMENTAL EXAMPLE 8

In the foregoing experimental examples, it was confirmed that the hard main layer demonstrated good wear resistance and corrosion resistance against a solid natural wood and laminated wood. In the Experimental Example 8, therefore, an experiment was conducted to compare the performances of cutting an MDF (Medium Density Fiberboard). That is, a cemented carbide replaceable knife coated only with a hard fundamental layer (sample 1) and a cemented carbide replaceable knife coated with a hard fundamental layer and a hard main layer (sample 2) were prepared, and a cutting test was conducted on medium density fiberboards. The layer structures of the samples 1 and 2 are given below. For the cemented carbide replaceable knife of each sample, the total thickness of the coated layers was set to be about 3.0 μm, and coating was performed on both the rake face and the clearance face.

TABLE 13

| Sample No. | Film Type | Layer Structure | Thickness |
|---|---|---|---|
| 1 | CrN | CrN | 3.0 μm |
| 2 | CrN + CrO | CrN + Cr$_2$O$_3$ | 2.0 + 1.0 μm |

The end faces of medium density fiberboards were cut using the samples 1 and 2, and the amount of wear at that portion of the medium density fiberboard which was cut on the high-density surface layer portion (top surface) side, and the amount of wear at that portion of the medium density fiberboard which was cut on the low-density center portion (inner portion) side were measured. The following are the cutting conditions.
Machine: NC horizontal spindle cutting machine
Work piece material: medium density fiberboard (tropical wood)
Cutting tool: milling cutter (cutting diameter of 125 mm)
Feeding speed: 4 m/min
Rotational speed: 6000 RPM
Depth of cut: 0.5 mm
Cutting length of work piece: 1000 m The following are the results of the above experiment obtained.

TABLE 14

| | Amount of recession of cutting edge (rake face) | | Wear land width on rake face | |
|---|---|---|---|---|
| Sample No. | MDF surface layer portion | MDF center portion | MDF surface layer portion | MDF center portion |
| 1 | 20 μm | 12 μm | 44 μm | 21 μm |
| 2 | 17 μm | 10 μm | 32 μm | 17 μm |

FIG. 12 shows the cross-sectional shape of the edge of each sample after the cutting test. The left column in FIG. 12 shows the results of the surface layer portion side (MDF surface layer portion) of the medium density fiberboard, and the right column in FIG. 12 shows the results of the center portion (MDF center portion) of the medium density fiberboard.

It is apparent from the results of the above experiment that the sample 1 shows large values for the amount of recession of cutting edge and the wear land width on rake face at both the surface layer portion and the center portion of the medium density fiberboard. Particularly, the wear land width on rake face of the sample 1 is large on the surface layer portion side of the medium density fiberboard. On the other hand, the sample 2 coated with the hard main layer shows smaller values for the amount of recession of cutting edge and the wear land width on rake face than those of the sample 1. It is to be noted that both samples show much larger wear on the surface layer portion side of the medium density fiberboard. This seems to have resulted from the surface layer portion of the medium density fiberboard having a high density and the load becoming larger at the time of cutting. As shown in FIG. 12, the edge of the sample 1 has a rounded shape, whereas the edge of the sample 2 has a sharp cross-sectional shape. From the results of the Experimental Example 8, it was confirmed that the hard main layer could demonstrate excellent wear resistance and corrosion resistance against medium density fiberboards.

EXPERIMENTAL EXAMPLE 9

The cutting test was conducted with the rake face coated in the Experimental Examples 1 to 7, and with the rake face and the clearance face coated in the Experimental Example 8, whereas the test to check the cutting performance when only the clearance face was coated was conducted in the Experimental Example 9. In this experiment, a tipped saw blade was used as a wood cutting tool and the clearance face of the cemented carbide tip was coated. That is, the cutting tests were conducted both on the sample 1 prepared by coating only the hard fundamental layer on the clearance face of the cemented carbide tip, and the sample 2 prepared by coating both the hard fundamental layer and the hard main layer on the clearance face of the cemented carbide tip were prepared. The layer structures of the samples 1 and 2 are given below. The tipped saw blade used in this experiment had an outside diameter of 180 mm, a blade thickness of 2.6 mm, a body thickness of 1.8 mm, a bore diameter of 25.4 mm, and 24 teeth, and the coating thickness was about 3.0 μm for each sample.

TABLE 15

| Sample No. | Film Type | Layer Structure | Thickness |
|---|---|---|---|
| 1 | CrN | CrN | 3.0 μm |
| 2 | CrN + CrO | CrN + Cr$_2$O$_3$ | 2.4 + 0.6 μm |

Using the samples 1 and 2, hinoki (Japanese cypress) as a work piece material was cut. The following are the cutting conditions.
Machine: NC horizontal spindle cutting machine
Work piece material: hinoki (Japanese cypress) (moisture content of 50 to 90%)
Cutting tool: tipped saw blade (cutting diameter of 180 mm)
Feeding speed: 2 m/min
Rotational speed: 6800 RPM
Depth of cut: 2.0 mm
The following are the results of the above experiment obtained.

TABLE 16

| Sample No. | Amount of recession of cutting edge (clearance face) | Wear land width on clearance face |
|---|---|---|
| 1 | 32 μm | 11 μm |
| 2 | 29 μm | 5 μm |

Figure 13:
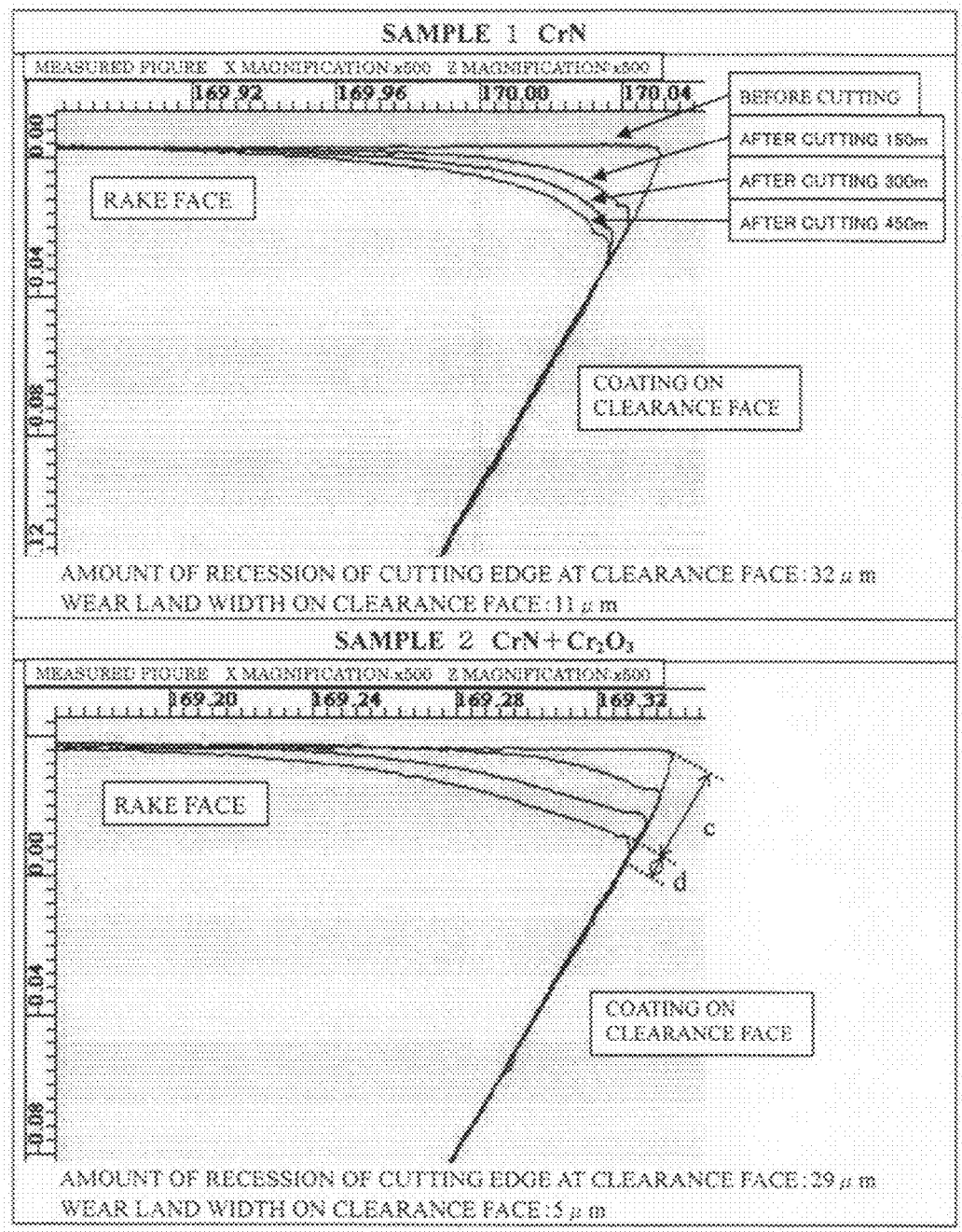
[FIG. 13] A cross-sectional view of edges of samples 1 and 2 showing experimental results of Experimental Example 9.

FIG. 13 shows the cross-sectional shape of the edge of each sample after cutting 150 m, 300 m, and 450 m. The amount of recession of cutting edge (clearance face) and the wear land width on clearance face are the amounts of wear respectively indicated by reference numeral c and reference numeral d in FIG. 13.

Further, an experiment to compare the cutting powers for the samples 1 and 2 cutting 450 m of hinoki (Japanese cypress) in the experiment was also conducted. In this experiment, a dried spruce was used as a work piece material. The following are the cutting conditions.
Rotational speed: 6800 RPM
Feeding speed: 2 m/min or 4 m/min
Depth of cut: 2 mm The results are shown in FIG. 14. In a graph in FIG. 14, solid lines show the sample 1, and broken lines show the sample 2.

It is apparent from the results in Table 16 that both the amount of recession of cutting edge and the wear land width on clearance face are smaller for the sample 2 which is coated with the hard main layer. Particularly, the wear land width on clearance face of the sample 2 takes a very small value. As apparent from FIG. 13, the edge of the sample 1 is worn to have a rounded shape, whereas the edge of the sample 2 keeps a sharp cross-sectional shape. Further, as apparent from the results in FIG. 14, at any feeding speed, the cutting power of the sample 2 is smaller than that of the sample 1 by 10% or so. That is, it seems that the sample 1 worn to have a rounded edge cross-sectional shape so that the cutting power was increased, whereas the sample 2 keeps a sharp edge cross-sectional shape to thereby suppress an increase in cutting power. In the Experimental Example 9, therefore, it was confirmed that even when the hard main layer was coated only on the clearance face, the tipped saw blade according to the sample 2 coated with the hard main layer could demonstrate very good wear resistance and corrosion resistance.

Although a cemented carbide alloy or a high speed tool steel is used as the substrate 12, 32, 52, 72 in the embodiments and the experimental examples, a substrate formed of a bearing steel can be used. In the embodiments and the experimental examples, the hard fundamental layer 18, 36, 56, 74 is directly coated on the substrate 12, 32, 52, 72, and the hard main layer 20, 38, 58, 60, 76 is directly coated on the hard fundamental layer 18, 36, 56, 74. From the viewpoint of an improvement on the adhesion or the like, however, another layer (intermediate layer) of TiN or the like may be intervened between the substrate 12, 32, 52, 72 and the hard fundamental layer 18, 36, 56, 74, or between the hard main layer 18, 36, 56, 74 and the hard main layer 20, 38, 58, 60, 76. That is, the hard fundamental layer 18, 36, 56, 74, and the hard main layer 20, 38, 58, 60, 76 may be indirectly coated on the substrate 12, 32, 52, 72, and the hard fundamental layer 18, 36, 56, 74, respectively.

Further, when the hard fundamental layer 18, 36, 56, 74 or the hard main layer 20, 38, 58, 60, 76 is made to have a multi-layer structure, an intermediate layer of TiN or the like may be intervened between the hard fundamental layers 18, 36, 56, 74 or the hard main layers 20, 38, 58, 60, 76, respectively. In this case, it is desirable that the total thickness of the layers including the hard fundamental layer 18, 36, 56, 74 and the intermediate layers intervening between those layers should be in the aforementioned range of about 0.075 μm to 10.0 μm. With regard to the hard main layers 20, 38, 58, 60, 76, likewise, the total thickness of the layers including the intermediate layers should be in the aforementioned range of about 0.2 μm to 5.0 μm. Further, from the viewpoint of improving the protection power or the like, the outermost layer (hard main layer) is coated with another layer (protection layer) of TiN or the like.

The invention claimed is:

1. A wood cutting tool having a hard fundamental layer containing at least one selected from the group consisting of a chromium material and a chromium nitride material and coated on at least a rake face or a clearance face of a substrate formed of a cemented carbide alloy, a bearing steel or a tool steel,
   wherein the hard fundamental layer is coated with a hard main layer containing a chromium oxide material,
   a thickness of the hard main layer is about 0.2 μm to 5.0 μm,
   a thickness of the hard fundamental layer is about 0.075 μm to 10.0 μm,
   the hard fundamental layer and the hard main layer are alternately laminated into plural laminates, and a total thickness of all the layers is about 15.0 μm or less.

* * * * *